(12) United States Patent
Maeda et al.

(10) Patent No.: US 9,349,926 B2
(45) Date of Patent: May 24, 2016

(54) LIGHT EMITTING MODULE

(75) Inventors: Shinpei Maeda, Shizuoka (JP); Tsukasa Tokida, Shizuoka (JP)

(73) Assignee: KOITO MANUFACTURING CO., LTD., Tokyo (JP)

(*) Notice: Subject to any disclaimer, the term of this patent is extended or adjusted under 35 U.S.C. 154(b) by 28 days.

(21) Appl. No.: 14/232,364

(22) PCT Filed: Jun. 21, 2012

(86) PCT No.: PCT/JP2012/065883
§ 371 (c)(1),
(2), (4) Date: Jan. 13, 2014

(87) PCT Pub. No.: WO2013/008601
PCT Pub. Date: Jan. 17, 2013

(65) Prior Publication Data
US 2014/0151726 A1 Jun. 5, 2014

(30) Foreign Application Priority Data

Jul. 14, 2011 (JP) ................................. 2011-155434

(51) Int. Cl.
*H01L 33/54* (2010.01)
*H01L 25/075* (2006.01)
(Continued)

(52) U.S. Cl.
CPC ............. *H01L 33/54* (2013.01); *F21S 48/1154* (2013.01); *F21S 48/1225* (2013.01); *F21S 48/1241* (2013.01); *F21S 48/1317* (2013.01); *F21S 48/1323* (2013.01); *F21S 48/1329* (2013.01); *H01L 25/0753* (2013.01);
(Continued)

(58) Field of Classification Search
None
See application file for complete search history.

(56) References Cited

U.S. PATENT DOCUMENTS

2005/0156178 A1   7/2005  Takeda et al.
2007/0034887 A1*  2/2007  Pang et al. ...................... 257/98
(Continued)

FOREIGN PATENT DOCUMENTS

EP        2211083 A1     7/2010
JP     2000-82849 A      3/2000
(Continued)

OTHER PUBLICATIONS

International Search Report (PCT/ISA/210), dated Jul. 17, 2012, issued by the International Searching Authority in counterpart International Patent Application No. PCT/JP2012/065883.
(Continued)

*Primary Examiner* — Fei Fei Yeung Lopez
(74) *Attorney, Agent, or Firm* — Sughrue Mion, PLLC

(57) ABSTRACT

There are provided a light emitting module including a luminescent material layer (15) which is disposed so as to cover a light emitting surface (13a) of a semiconductor light emitting element (13) and which changes a wavelength of at least part of light emitted from the semiconductor light emitting element, and a light shielding wall (16) which surrounds the semiconductor light emitting element and the luminescent material layer from the circumference thereof, and the luminescent material layer is bonded to the semiconductor light emitting element and the light shielding wall with a bonding resin (23) having a light transmittivity, a distal end portion of the light shielding wall is caused to project further forwards than the luminescent material layer, and a transparent resin (24) is applied so as to cover an exposed surface (20a) of a distal end portion (21) of the light shielding wall.

3 Claims, 4 Drawing Sheets

(51) Int. Cl.
  *H01L 33/52*  (2010.01)
  *H01L 33/58*  (2010.01)
  *F21S 8/10*  (2006.01)
  *H01L 33/44*  (2010.01)
  *H01L 33/50*  (2010.01)

(52) U.S. Cl.
  CPC ............... *H01L 33/52* (2013.01); *H01L 33/58* (2013.01); *H01L 33/44* (2013.01); *H01L 33/507* (2013.01); *H01L 2933/0058* (2013.01)

(56) References Cited

U.S. PATENT DOCUMENTS

| | | | |
|---|---|---|---|
| 2008/0002100 A1 | 1/2008 | Kaneko et al. | |
| 2010/0301359 A1* | 12/2010 | Liu | 257/98 |
| 2011/0032702 A1* | 2/2011 | Mizuno | 362/247 |

FOREIGN PATENT DOCUMENTS

| | | |
|---|---|---|
| JP | 2004-296792 A | 10/2004 |
| JP | 2008-10691 A | 1/2008 |
| JP | 2008-124168 A | 5/2008 |
| JP | 2011-40495 A | 2/2011 |
| KR | 10-0286829 B1 | 4/2001 |
| WO | 2009/041767 A2 | 4/2009 |
| WO | 2009/115976 A1 | 9/2009 |

OTHER PUBLICATIONS

Written Opinion (PCT/ISA/237), dated Jul. 17, 2012, issued by the International Searching Authority in counterpart International Patent Application No. PCT/JP2012/065883.

Office Action dated Dec. 24, 2014 issued by Korean Intellectual Property Office in counterpart Korean Patent Application No. 10-2013-7033817.

Office Action issued Oct. 27, 2015, issued by the European Patent Office in counterpart European Patent Application No. 12811949.2.

* cited by examiner

LIGHT EMITTING MODULE

TECHNICAL FIELD

The present invention relates to a light emitting module. The invention relates more particularly to a technical field in which a transparent resin is applied to distal end portions of light shielding walls which surround a semiconductor light emitting element from the circumference thereof to thereby form a clear cutoff line in a light distribution pattern.

BACKGROUND ART

There are light emitting modules which employ a semiconductor light emitting element such as a light emitting diode (LED) as a light source, and these light emitting modules are equipped, for example, in vehicle lamps which shine light emitted from the semiconductor light emitting element as illumination light. In these vehicle lamps, a predetermined light distribution pattern is formed by light shone as illumination light.

In these light emitting modules, there are some light emitting modules which has a plurality of semiconductor light emitting elements which shine light, a circuit board on which the semiconductor light emitting elements are mounted, luminescent material layers which change a wavelength of light emitted from the corresponding semiconductor light emitting elements, and light shielding walls which surround the semiconductor light emitting elements and the luminescent material layers from the circumference thereof (for example, refer to Patent Literature 1).

In a light emitting module described in Patent Literature 1, light emitted from each semiconductor light emitting element is prevented from being incident on the semiconductor light emitting elements which lie adjacent thereto by the light shielding walls which surround the semiconductor light emitting element and the luminescent material layer from the circumference thereof.

RELATED ART LITERATURE

Patent Literature

Patent Literature 1: JP-A-2011-40495

SUMMARY OF THE INVENTION

Incidentally, an external surface of the luminescent material layer does not have to project further forwards than distal ends of the light shielding walls in order to prevent the incidence of light emitted from each semiconductor light emitting element on the semiconductor light emitting elements which lie adjacent thereto. However, there exists a possibility that there are caused variances in height of each light shielding wall, thickness of each semiconductor light emitting element and thickness of the adhesive due to machining or working accuracy in the production process of the light emitting module. Consequently, in order to prevent the projection of the external surface of the luminescent material layer from the distal ends of the light shielding walls, the distal end portions of the light shielding walls are designed so as to project further forwards than the external surface of the luminescent material layer with an allowance which takes the variances described above into consideration.

In the light emitting module, part of the light emitted from the semiconductor emitting element and the luminescent material layer is reflected on the light shielding walls to thereby be shone as illumination light, part of which is then shone as direct illumination light. As this occurs, the quantity of light shone by the distal end portion of the light shielding wall which projects further forwards than the luminescent material layer becomes smaller than the quantity of light emitted from the other portions of the light shielding wall by such an extent that there is no light which is shone from the luminescent material layer as direct illumination light. Part of light which is reflected at the distal end portions of the light shielding walls constitutes light which forms a cutoff line.

In the light emitting module described in Patent Literature 1, as described above, since the quality of light shone after having been reflected at the distal end portion of the light shielding wall is smaller than the quantity of light which is shone from the other portions than the distal end portion of the light shielding wall, the cutoff line in the light distribution pattern becomes unclear, leading to a problem that a desired light distribution pattern cannot be formed.

Then, a problem to be solved by the invention is how to overcome the aforesaid problem, so as to form a clear cutoff line in a light distribution pattern.

Means for Solving the Problem (1) With a view to solving the problem, according to the invention, there is provided a light emitting module including a semiconductor light emitting element which has a light emitting surface from which light is emitted, a circuit board on which the semiconductor light emitting element is mounted, a luminescent material layer which is disposed so as to cover the emitting surface of the semiconductor light emitting element and which changes a wavelength of at least part of light emitted from the semiconductor light emitting element and a light shielding wall which is provided on the circuit board and which surrounds the semiconductor light emitting element and the luminescent material layer from the circumference thereof, and wherein the luminescent material layer is bonded to the semiconductor light emitting element and the light shielding wall with a bonding resin having a light transmittivity, wherein a distal end portion of the light shielding wall is caused to project further forwards than the luminescent material layer, and wherein a transparent resin having a light transmittivity is applied so as to cover at least an exposed surface of the distal end portion of the light shielding wall.

(2) In the invention described under (1) above, a plurality of semiconductor light emitting elements like the semiconductor light emitting element are mounted side by side at predetermined intervals, the same number of luminescent material layers like the luminescent material layer as the plurality of semiconductor light emitting elements are disposed so as to cover individually light emitting surfaces of the semiconductor light emitting elements, and the light shielding wall is provided so as to surround the plurality of semiconductor light emitting elements and the plurality of luminescent material layers from the circumference thereof.

(3) In the invention described under (1) or (2) above, the transparent resin is applied so as to cover the whole of an opening portion which is formed by the distal end portion of the light shielding wall which is caused to project further forwards than the luminescent material layer.

(4) In the invention described in any of (1) to (3) above, the transparent resin is made of the same material as that of the bonding resin.

Advantage of the Invention

According to the invention described under (1) above, part of the light emitted from the semiconductor light emitting element is internally reflected in the transparent resin, and the light which is internally reflected in the transparent resin is reflected on the light shielding wall to thereby increase the quantity of light at the distal end portion of the light shielding wall. Therefore, the difference between the quantity of light shone from the distal end portion of the light shielding wall and the quantity of light shone from the other portions than the distal end portion of the light shielding wall is reduced, thereby making it possible to form a clear cutoff line in the light distribution pattern.

According to the invention described under (2) above, the luminous intensity of the light distribution pattern formed by light emitted from the plurality of semiconductor light emitting elements can be made uniform, and a clear cutoff line can be formed.

According to the invention described under (3) above, light which is internally reflected in the transparent resin to be reflected on the exposed surface of the light shielding wall is increased, and therefore, the quantity of light which is shone from the distal end portion of the light shielding wall and the quantity of light which is shone from the other portions than the distal end portion of the light shielding wall become even, thereby making it possible to form a far clearer cutoff line in the light distribution pattern.

According to the invention described under (4) above, the transparent resin can be applied simultaneously in the step where the bonding resin is applied, and therefore, the light emitting module can easily be fabricated, and a reduction in the fabrication time of the light emitting module can be realized.

DESCRIPTION OF EMBODIMENTS

Hereinafter, referring to the accompanying drawings, a mode for carrying out a light emitting module of the invention will be described.

In a form which will be described below, a light emitting module of the invention is applied to a light emitting module which is provided in a vehicle headlamp. It is noted that the application of the light emitting module of the invention is not limited the light emitting module provided in the vehicle headlamp and hence that the invention can also widely be applied to other various types of vehicle lamps than the vehicle headlamp.

A vehicle headlamp 1 is disposed mounted at each of left- and right-hand end portions of a front end portion of a vehicle body.

Figure 1:
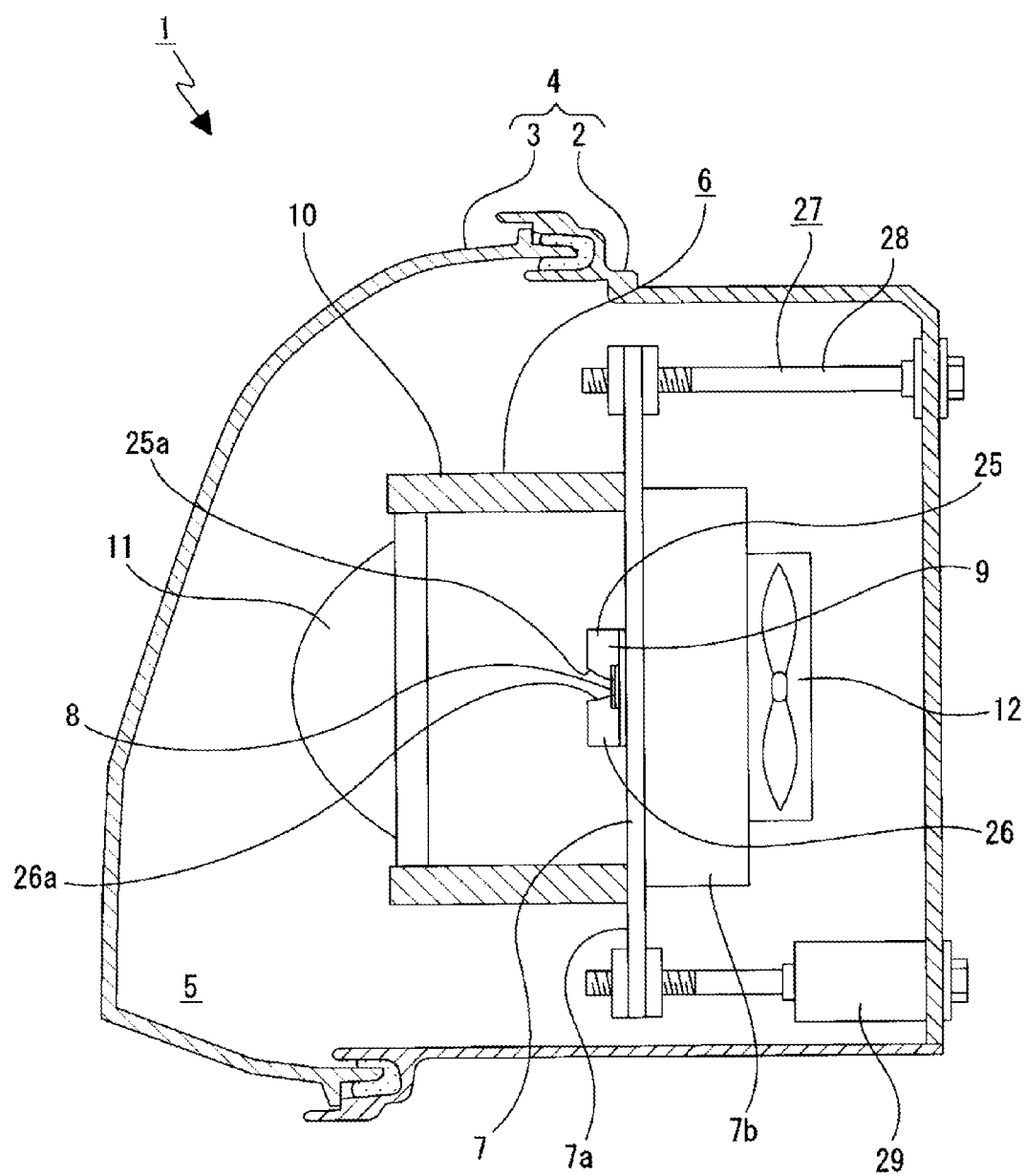
FIG. 1 shows an embodiment of the invention together with FIGS. 2 to 4 and is a schematic vertical sectional view of a vehicle headlamp.

As shown in FIG. 1, the vehicle headlamp 1 includes a lamp housing 2 which is formed into a concave shape which is opened to the front and a cover 3 which closes an opening side of the lamp housing 2, and a lamp outer housing 4 is made up of the lamp housing 2 and the cover 3. An interior space of the lamp outer housing 4 is formed as a lamp compartment 5.

A lamp unit 6 is disposed in the lamp compartment 5. The lamp unit 6 has a bracket 7, a light emitting module 8, a reflector 9, a lens holder 10 and a projection lens 11.

The bracket 7 is formed, for example, of a metallic material having high thermal conductivity, and a front surface thereof is formed as a mounting surface 7a. Heat dissipating fins 7b are provided on a rear surface of the bracket 7 so as to project to the rear.

A fan 12 is attached to rear surfaces of the heat dissipating fins 7b which are provided on the bracket 7. Heat generated when the light emitting module 8 is driven is dissipated by the heat dissipating fins 7b and the fan 12.

Figure 2:
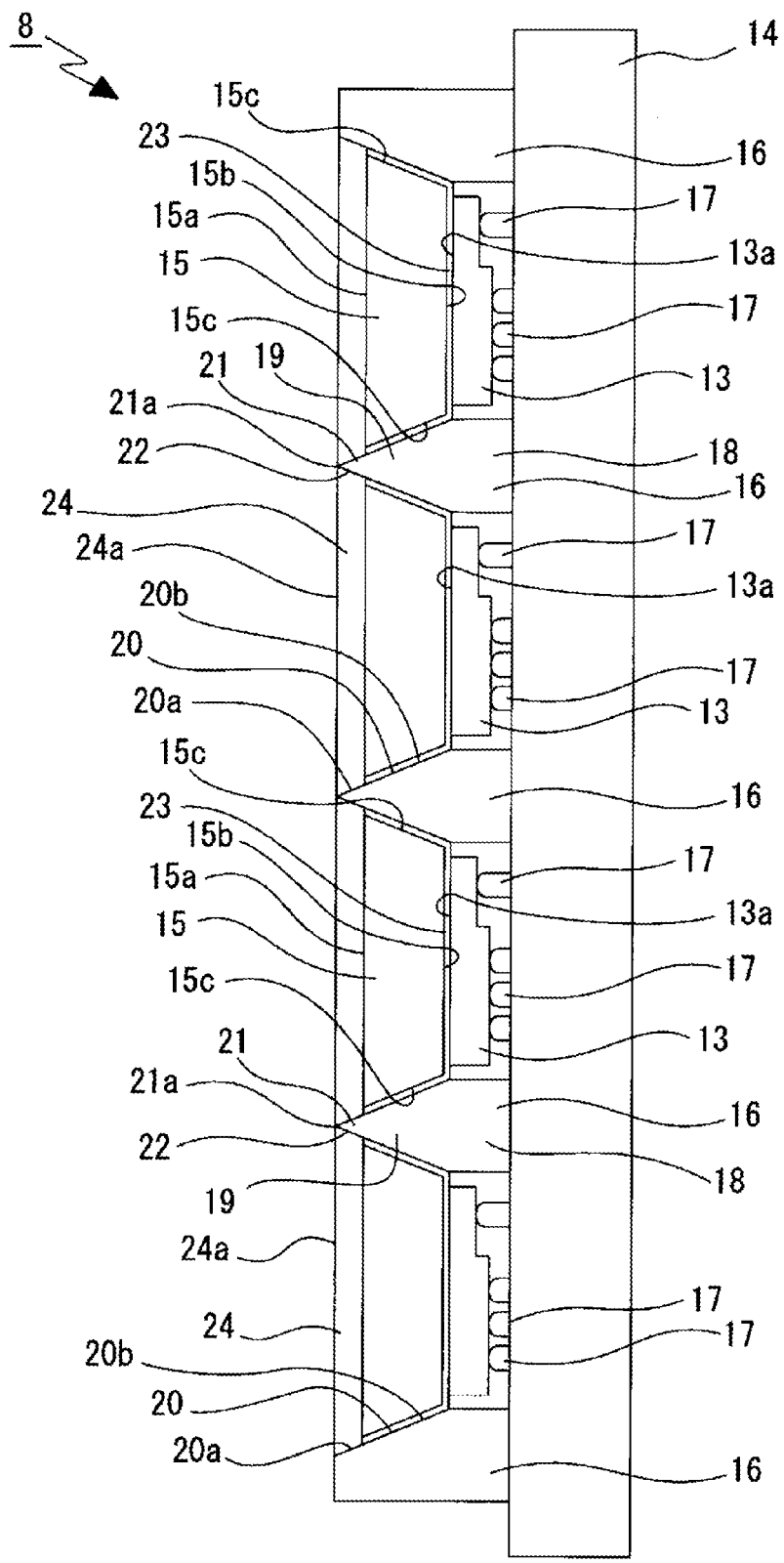
FIG. 2 is an enlarged sectional view of a light emitting module.

As shown in FIG. 2, the light emitting module 8 has semiconductor light emitting elements 13 which emit light, a circuit board 14 on which the semiconductor light emitting elements 13 are mounted, luminescent material layers 15 which change a wavelength of at least part of light emitted from the semiconductor light emitting elements 13 and light shielding walls 16 which are provided on the circuit board 14.

Front surfaces of the semiconductor light emitting elements 13 are made into light emitting surfaces 13a from which light is emitted, and rear surfaces thereof are made into surfaces on which the light emitting elements 13 are mounted on the circuit board 14. The semiconductor light emitting elements 13 are provided side by side at predetermined intervals in a left-to-right direction. For example, a light emitting diode (LED) which emits light of a blue wavelength is used as the semiconductor light emitting elements 13.

The circuit board 14 is mounted on a central portion of the mounting surface 7a of the bracket 7 (refer to FIG. 1).

The semiconductor light emitting elements 13 are each connected to a circuit pattern, not shown, which is formed on the circuit board 14 via connecting terminals 17. The semiconductor light emitting elements 13 can be individually and separately illuminated to emit light by means of a driving voltage supplied from a power supply circuit, not shown.

The luminescent material layers 15 are formed, for example, of a material such as ceramic or glass and are disposed so as to cover the corresponding light emitting surfaces 13a of the semiconductor light emitting elements 13. The luminescent material layers 15 are each formed into a truncated quadrangular prism whose external form expands as they extend to the front, and external surfaces thereof are made up of a front surface 15a, a rear surface 15b and four side surfaces 15c which are inclined so as to displaced outwards as they extend to the front. The rear surface 15b has substantially the same size of that of the light emitting surface 13a of the semiconductor light emitting element 13, and the front surface 15a is made larger than the rear surface 15b. As the luminescent material layers 15 a layer is used which has a yellow luminescent material which emits light of a yellow wavelength by being excited, for example, by light of a blue wavelength.

In the light emitting module 8, blue light emitted from the semiconductor light emitting elements 13 and yellow light emitted from the luminescent material layers 15 are mixed together to emit white light.

The light shielding walls 16 are individually caused to project to the front from the circuit board 14 and are provided so as to surround vertically and horizontally the corresponding semiconductor light emitting elements 13 and luminescent material layers 15. The light shielding walls 16 are each formed, for example, into a pentagonal prism which extends horizontally or vertically.

The light shielding walls 16 are each made up of an erected portion 18 which connects to a front surface of the circuit board 14 and which is directed vertically or horizontally and an inclined portion 19 which is inclined so that both surfaces (external surfaces) thereof approach each other as the inclined portion 19 extends to the front from a front end of the erected portion 18. The external surfaces of the inclined portion 19 are formed as inclined surfaces 20, and a front end of a distal end portion (a front end portion) 21 is made into an apex portion 21a. The inclined surfaces 20 are inclined individually at an angle at which the inclined surfaces 20 follow individually the side surfaces 15c of the luminescent material layers 15.

Outer circumferential surfaces of the light shielding walls 16 which do not surround the semiconductor light emitting elements 13 and the luminescent material layers 15 may be directed vertically and horizontally without having an inclined surface as shown in FIG. 2.

The semiconductor light emitting element 13 is surrounded by the erected portions 18 of the four light shielding walls 16 from the circumference thereof, and the luminescent material layer 15 is surrounded by the inclined portions 19 of the four light shielding walls 16 from the circumference thereof. The four side surfaces 15c of the luminescent material layer 15 and the four inclined surfaces 20 which surround the luminescent material layer 15 from the circumference thereof individually stand opposite to each other. The distal end portions 21 of the inclined portions 19 are positioned further forwards than the front surface 15a of the luminescent material layer 15. Of the inclined surfaces 20 external surfaces of the distal end portions 21 are made into exposed surfaces 20a while of the inclined surfaces 20, other surfaces than the distal end portions 21 are made into surrounding surfaces 20b. Consequently, the luminescent material layer 15 is surrounded from the circumference thereof by the four surrounding surfaces 20b.

In the light emitting module 8, portions which are each surrounded by the four distal end portions 21 are formed as opening portions 22 which are positioned at front sides of the luminescent material layers 15.

In the luminescent material layer 15, the rear surface 15b is bonded to the light emitting surface 13a of the semiconductor light emitting element 13 with a bonding resin 23, and the four side surfaces 15c are bonded individually to the four surrounding surfaces 20b of the light shielding walls 16 with the bonding resin 23. The thickness of the bonding resin 23 applied between the luminescent material layer 15 and the semiconductor light emitting element 13 and the thickness of the bonding resin 23 applied between the luminescent material layer 15 and the light shielding walls 16 are substantially uniform and the bonding resin 23 applied thin therebetween. Consequently, the side surfaces 15c of the luminescent material layer 15 and the surrounding surfaces 20b of the light shielding walls 16 are positioned close to each other.

The bonding resin 23 has light transmittivity, and for example, a silicone-based material is used as the boding resin 23.

A transparent resin 24 is applied to cover the front surface 15a of the luminescent material layer 15 and the exposed surfaces 20a of the four light shielding walls 16. Namely, the transparent resin 24 is applied to cover the whole of the opening portion 22. The transparent resin 24 is applied substantially uniform, and a front surface 24a thereof is positioned on the same plane as a plane formed by the apex portions 21a of the four distal end portions 21.

The transparent resin 24 has light transmittivity, and for example, the same material as that of the bonding resin 23 is used as the transparent resin 24.

While the transparent resin 24 and the bonding resin 23 are described exemplarily as being made of the same material, the transparent resin and the bonding resin may be made of different materials, as long as the materials are resins having light transmittivity. For example, the transparent resin may be made of the same material as that of the luminescent material layer 15. As this occurs, as described above, since the apex portions 21a of the distal end portions 21 of the light shielding walls 16 are positioned on the same plane as the front surface of the transparent resin, light which is shone from the transparent resin made of the same material as that of the luminescent material 15 as direct illumination light exists at the distal end portions 21.

The reflector 9 is made up of an upper reflector 25 which is disposed at an upper side of the light emitting module 8 and a lower reflector 26 which is disposed at a lower side of the light emitting module 8 (refer to FIG. 1). The upper reflector 25 and the lower reflector 26 have a substantially downwardly oriented surface on a side facing the light emitting module 8 and a substantially upwardly oriented surface on a side facing the light emitting module 8, respectively, and these surfaces are formed as reflecting surfaces 25a, 26a. The reflector 9 has a function to reflect light emitted from the light emitting module 8 towards the projection lens 11.

The lens holder 10 is mounted on the mounting surface 7a of the bracket 7 and is formed into a ring-like shape which penetrates substantially in the front-to-rear direction and is provided so as to cover the light emitting module 8.

The projection lens 11 is mounted at a front end portion of the lens holder 10 and is held ahead of the light emitting module 8 by the lens holder 10. The projection lens 11 has a function to project light emitted from the light emitting module 8 to the front.

The lamp unit 6 is supported in the lamp housing 2 so as to tilt freely by a light axis control mechanism 27. The light axis control mechanism 27 has aiming screws 28, 28 and a leveling actuator 29.

The aiming screws 28 (only one of which is shown in FIG. 1) are positioned so as to be spaced apart from each other in the left-to-right direction and each connect an upper end portion of the bracket 7 with an upper end portion of the lamp housing 2. The lamp unit 6 is tilted substantially vertically or substantially horizontally by the aiming screw 28 being rotated, whereby the aiming of the lamp unit 6 is controlled.

The leveling actuator 29 connects a lower end portion of the bracket 7 with a lower end portion of the lamp housing 2. The lamp unit 6 is tilted substantially vertically by the leveling actuator 29 being driven, whereby the leveling of the lamp unit 6 is controlled.

In the vehicle headlamp 1 which is configured as described above, a driving voltage is applied individually and separately to the semiconductor light emitting elements 13 of the light emitting module 8 from the power supply circuit, whereby light is emitted from the emitting surfaces 13a of the predetermined semiconductor light emitting elements 13 to which the driving voltage is applied.

When light is emitted from the semiconductor light emitting elements 13, part of light is emitted to the front through the bonding resins 23, the luminescent material layers 15 and the transparent resins 24.

In addition, when light is emitted from the semiconductor light emitting elements 13, another part of the light passes through the bonding resin 23 and thereafter is reflected internally on the front surface 15a of the luminescent material layer 15 or the front surface 24a of the transparent resin 24. Part of the light reflected internally on the front surface 15a or the front surface 24a is totally reflected on the surrounding surfaces 20b of the light shielding walls 16 to thereby be emitted to the front.

Figure 3:
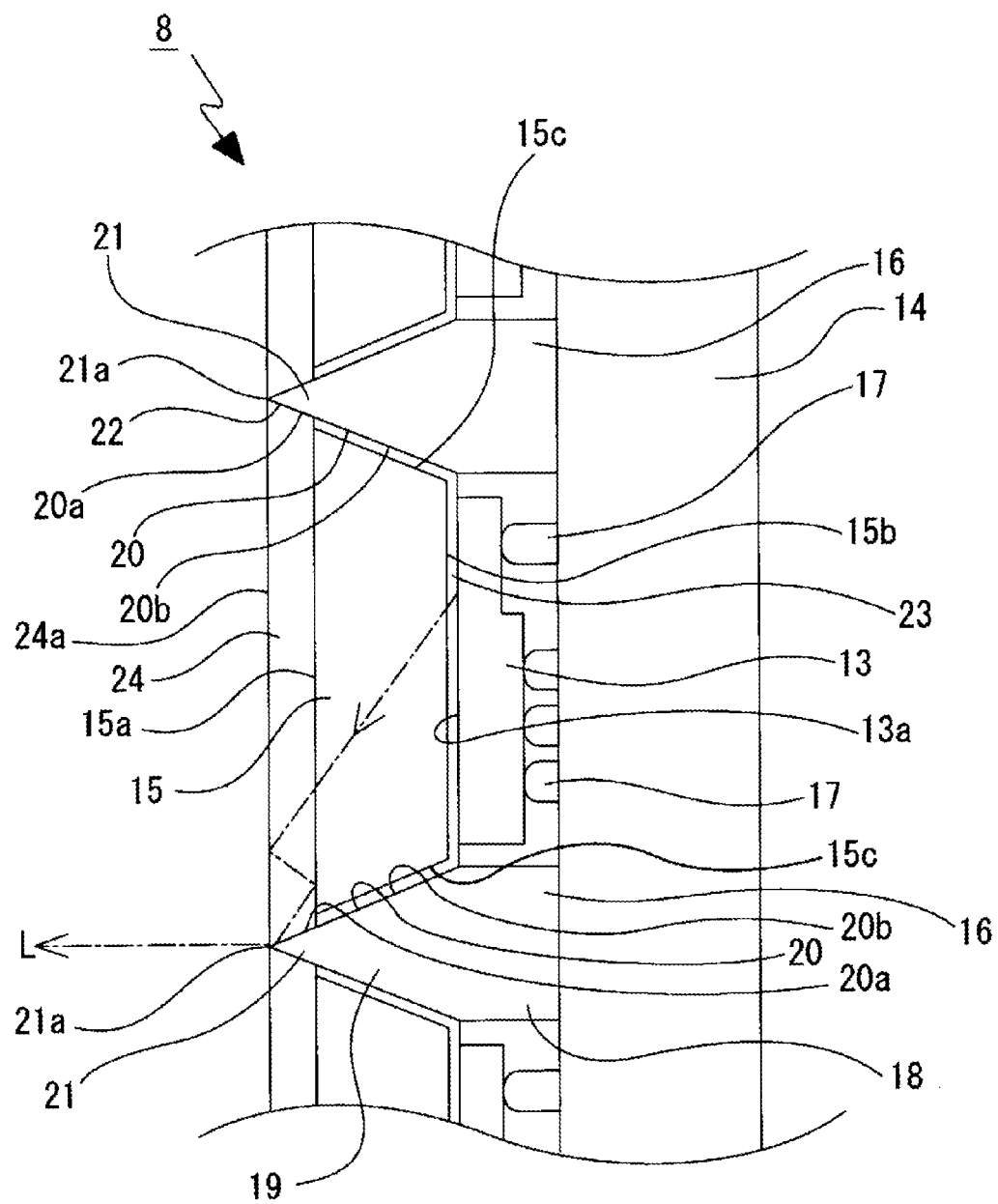
FIG. 3 is a conceptual drawing which shows an optical path of light emitted from a semiconductor light emitting element.

In addition, part of the light which is reflected internally on the front surface 24a is, as shown in FIG. 3, is guided in the transparent resin 24 and is then reflected totally on the exposed surfaces 20a of the light shielding walls 16 to thereby be emitted to the front (an optical path L). Part of the light which is reflected on the exposed surfaces 20a to be emitted to the front constitutes light which forms a cutoff line of a light distribution pattern.

Light emitted from the light emitting module 8 is reflected by the reflector 9 to be directed towards the projection lens 11 or travels directly thereto without being reflected by the reflector 9 and is shone to the front by the projection lens 11 to form a desired light distribution pattern.

In the light emitting module 8, as described above, the transparent resin 24 is applied to a front side of the luminescent material layer 15, and an internal reflection is produced on the front surface 24a of the transparent resin 24.

Consequently, light which is emitted from the semiconductor light emitting elements 13 and is then reflected internally on the front surface 24a of the transparent resin 24 is reflected on the exposed surfaces 20a of the light shielding walls 16 to increase the quantity of light which is shone from the distal end portions 21 of the light shielding walls 16, whereby the quantity of light which is shone at the distal end portions 21 and the quantity of light which is shone at the other portions than the distal end portions 21 become substantially even. This can form a light distribution pattern with a clear cutoff line.

In the description made above, while the transparent resin 24 is described exemplarily as being applied to close the whole of the opening portion 22 which is formed by the distal end portions 21 of the light shielding walls 16, the transparent resin 24 may be applied in such a way as to close part of the opening portion 22, as long as the light reflected internally therein is directed totally to the exposed surfaces 20a.

Figure 4:
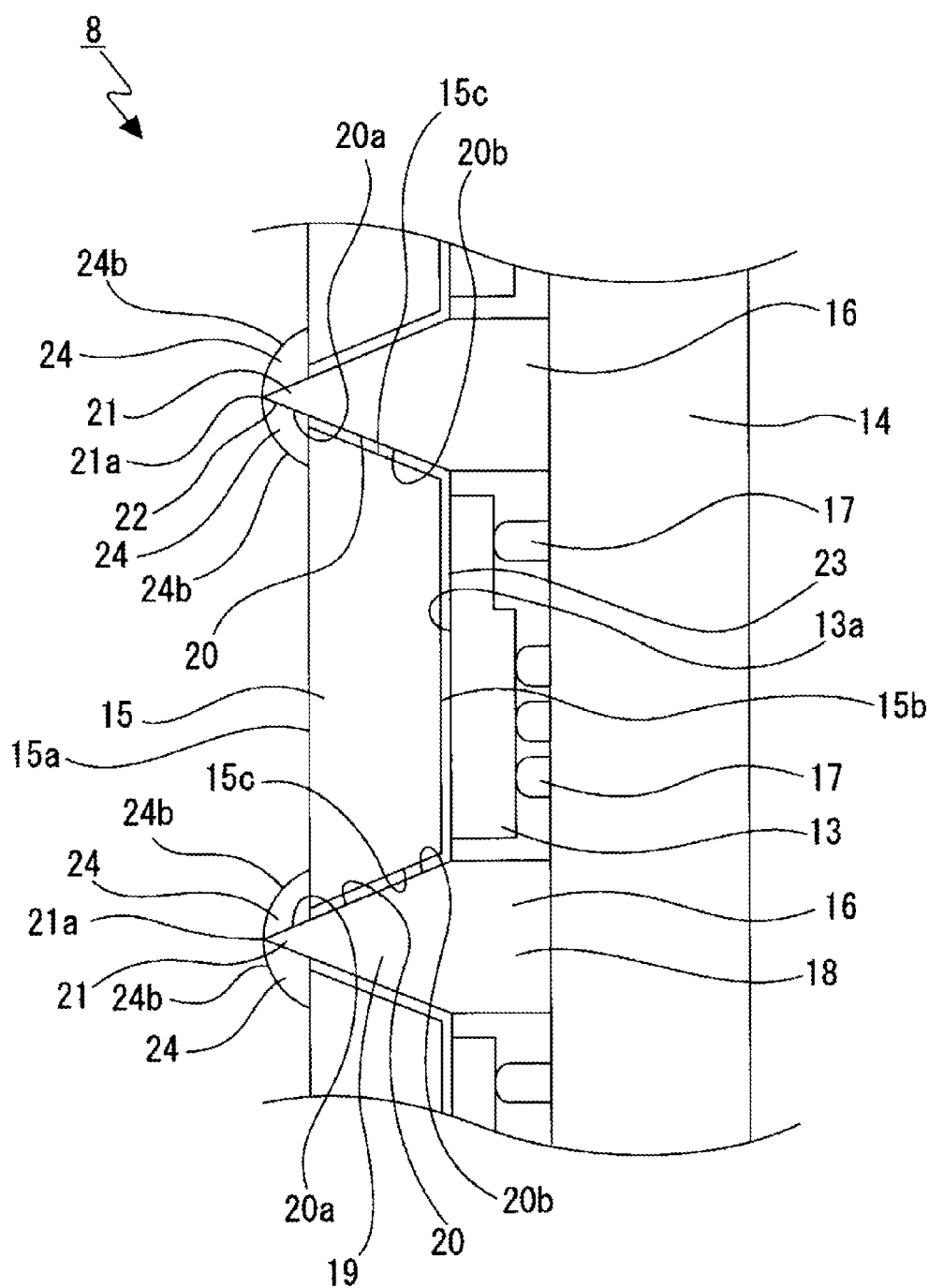
FIG. 4 is an enlarged sectional view showing an example in which a transparent resin is applied to portions of an opening portion.

For example, the transparent resin 24 may be applied only to an outer circumferential portion of the opening portion 22 in such a way as to cover the exposed surfaces 20a (refer to FIG. 4). Also, in the case of the transparent resin 24 being applied only to the outer circumferential portion of the opening portion 22, as in the case of the transparent resin 24 being applied in such a way as to cover the whole of the opening portion 22, since an internal reflection is generated on an external surface 24b of the transparent resin 24, part of light is totally reflected by the exposed surfaces 20a to thereby be emitted to the front. Consequently, the quantity of light which is shone at the distal end portions 21 of the light shielding walls 16 is increased, whereby the difference between the quantity of light shone at the distal end portions 21 and the quantity of light shone at the other portions than the distal end portions 21 is reduced.

When the transparent resin 24 is applied only to the outer circumferential portion of the opening portion 22, the evenness in quantity of light between light shone at the distal end portions 21 and light shone at the other portions than the distal end portions 21 can be ensured while reducing the amount of transparent resin 24 used to reduce, in turn, the production costs.

In addition, in the description made above, while the light emitting module 8 is described exemplarily as having the plurality of semiconductor light emitting elements 13 and the plurality of luminescent material layers 15, the light emitting module 8 may be configured so that one semiconductor light emitting element 13 and one luminescent material layer 15 are surrounded from the circumference thereof by a plurality of light shielding walls 16.

Thus, as has been described heretofore, in the light emitting module 8, part of light which is emitted from the semiconductor light emitting element 13 and which is reflected internally on the front surface 24a or the external surface 24b of the transparent resin 24 is reflected on the exposed surfaces 20a of the light shielding walls 16 to be shone to the front for formation of a light distribution pattern.

Consequently, since the quantity of light shone at the distal end portions 21 of the light shielding walls 16 is increased, the difference between the quantity of light shone at the distal end portions 21 and the quantity of light shone at the other portions than the distal end portions 21 is reduced, thereby making it possible to form a clear cutoff line in a light distribution pattern.

In addition, in the light emitting module 8, the light shielding walls 16 are provided so as to surround individually the plurality of semiconductor light emitting elements 13 and the plurality of luminescent material layers 15 from the circumference thereof.

Consequently, light which is emitted from the semiconductor light emitting elements 13 and which is reflected internally is reflected on the exposed surfaces 20a of the light shielding walls 16, whereby the difference between the quantity of light shone at the distal end portions 21 and the quantity of light shone at the other portions than the distal end portions 21 is reduced. Therefore, not only can a uniform luminous intensity be achieved in a light distribution pattern which is formed by light emitted from the plurality of semiconductor light emitting elements 13 be made uniform, but also a clear cutoff line can be formed.

Further, in the light emitting module 8, the transparent resin 24 is applied so as to close the whole of the opening portion 22 formed by the distal end portions 21 of the light shielding walls 16.

Consequently, the area in the transparent resin 24 where light is internally reflected is increased and part of light which is reflected internally on the front surface 24a of the transparent resin 24 is directed to the exposed surfaces 20a. This increases the quantity of light which is reflected on the exposed surfaces 20a, whereby the quantity of light shone at the distal end portions 21 and the quantity of light shone at the other portions than the distal end portions 21 become even, thereby making it possible to form a clearer cutoff line in a light distribution pattern.

Furthermore, in the light emitting module 8, the transparent resin 24 and the bonding resin 23 are made of the same material.

Consequently, since the transparent resin 24 can be applied simultaneously in the step of applying the bonding resin 23, not only can the light emitting module 8 be fabricated easily, but also the fabrication time of the light emitting module 8 can be reduced.

All the shapes and constructions of the individual portions described in the embodiment which has been described heretofore are only the specific examples made in carrying out the invention, and therefore, the technical scope of the invention should not be construed in a limited fashion by them.

While the invention has been described in detail and by reference to the specific embodiment, it is obvious to those skilled in the art to which the invention pertains that various alterations or modifications can be made thereto without departing from the spirit and scope of the invention.

This patent application is based on Japanese Patent Application No. 2011-155434 filed on Jul. 14, 2011, the contents of which are incorporated herein by reference.

DESCRIPTION OF REFERENCE NUMERALS 8 light emitting module; 13 semiconductor light emitting element; 13a light emitting surface; 14 circuit board; 15 luminescent material layer; 16 light shielding wall; 20a exposed surface; 21 distal end portion; 22 opening portion; 23 bonding resin; 24 transparent resin.

The invention claimed is:

1. A light emitting module comprising:
a semiconductor light emitting element which has a light emitting surface from which light is emitted;
a circuit board on which the semiconductor light emitting element is mounted;
a luminescent material layer which is disposed so as to cover the emitting surface of the semiconductor light emitting element and which changes a wavelength of at least part of light emitted from the semiconductor light emitting element; and
a light shielding wall which is provided on the circuit board and which surrounds the semiconductor light emitting element and the luminescent material layer from the circumference thereof, and
wherein the luminescent material layer is bonded to the semiconductor light emitting element and the light shielding wall with a bonding resin having a light transmittivity,
wherein a distal end portion of the light shielding wall is caused to project further forwards than the luminescent material layer, and
wherein a transparent resin having a light transmittivity is applied so as to cover at least an exposed surface of the distal end portion of the light shielding wall, wherein the transparent resin is applied only to an outer circumferential portion of an opening portion which is formed by the distal end portion of the light shielding wall which is caused to project further forward than the luminescent material layer;
wherein the transparent resin is made of the same material as that of the bonding resin.

2. The light emitting module according to claim 1, further comprising:
a plurality of semiconductor light emitting elements like the semiconductor light emitting element are mounted side by side at predetermined intervals on the circuit board,
wherein the same number of luminescent material layers like the luminescent material layer as the plurality of semiconductor light emitting elements are disposed so as to cover individually light emitting surfaces of the semiconductor light emitting elements, and
wherein the light shielding wall is provided so as to surround the plurality of semiconductor light emitting elements and the plurality of luminescent material layers from the circumference thereof.

3. The light emitting module according to claim 1,
wherein the transparent resin is applied so as to cover the whole of an opening portion which is formed by the distal end portion of the light shielding wall which is caused to project further forwards than the luminescent material layer.

* * * * *